United States Patent
Abe

(10) Patent No.: US 10,964,510 B2
(45) Date of Patent: Mar. 30, 2021

(54) SCANNING ELECTRON MICROSCOPE AND IMAGE PROCESSING METHOD

(71) Applicant: JEOL Ltd., Tokyo (JP)

(72) Inventor: Akira Abe, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/682,369

(22) Filed: Nov. 13, 2019

(65) Prior Publication Data

US 2020/0161087 A1    May 21, 2020

(30) Foreign Application Priority Data

Nov. 15, 2018  (JP) .............................. JP2018-214674

(51) Int. Cl.
*H01J 37/28* (2006.01)
*G06T 7/00* (2017.01)
*H01J 37/22* (2006.01)

(52) U.S. Cl.
CPC ............ *H01J 37/28* (2013.01); *G06T 7/0002* (2013.01); *H01J 37/222* (2013.01); *G06T 2207/10061* (2013.01)

(58) Field of Classification Search
CPC ....... H01J 37/28; H01J 37/222; G06T 7/0002; G06T 2207/10061
See application file for complete search history.

(56) References Cited

U.S. PATENT DOCUMENTS

2012/0104250 A1    5/2012 Bean et al.

FOREIGN PATENT DOCUMENTS

| JP | 63116348 A | 5/1988 |
| JP | 200987280 A | 4/2009 |
| JP | 201299481 A | 5/2012 |

OTHER PUBLICATIONS

Office Action issued in JP 2018-214674 dated Jan. 5, 2021.

*Primary Examiner* — Nicole M Ippolito
*Assistant Examiner* — Hanway Chang
(74) *Attorney, Agent, or Firm* — The Webb Law Firm

(57) ABSTRACT

A scanning electron microscope includes a first detector for detecting electrons, a second detector for detecting X-rays, and an image processor section for causing first markers indicative of imaging positions and second markers indicative of analysis positions to be displayed on a display device such that the first and second markers are placed on a whole image of a sample. The image processor section alters the magnification of the whole image based on instructions for altering the magnification of the whole image displayed on the display device. The image processor section displays new first markers of the same size as the first markers placed on the unaltered magnification whole image such that the new first markers are placed on the altered magnification whole image. The image processor section causes new second markers of the same size as the second markers placed on the unaltered magnification whole image to be placed on the altered magnification whole image.

15 Claims, 9 Drawing Sheets

SCANNING ELECTRON MICROSCOPE AND IMAGE PROCESSING METHOD

CROSS-REFERENCE TO RELATED APPLICATION

This application claims priority to Japanese Patent Application No. 2018-214674 filed Nov. 15, 2018, the disclosure of which is hereby incorporated by reference in its entirety.

BACKGROUND OF THE INVENTION

Field of the Invention

The present invention relates to a scanning electron microscope and image processing method.

Description of Related Art

A scanning electron microscope equipped with an energy dispersive X-ray analyzer can perform elemental analysis to obtain compositional information of a sample.

Such a scanning electron microscope may be equipped with an optical imaging device capable of optical imaging in order to derive whole images of a sample. For example, JP-A-63-116348 discloses a scanning electron microscope equipped with an optical microscope for deriving optical images. In the scanning electron microscope of JP-A-63-116348, the optical microscope is used to check analysis positions.

Furthermore, in the scanning electron microscope of JP-A-63-116348, markers corresponding to a range of field of view of a scanning electron microscope (SEM) image can be displayed on an optical image taken by the optical microscope. Consequently, one can have a grasp of the positions on the optical image at which the SEM image has been captured.

With a scanning electron microscope, however, observations at high magnifications of 10,000 times and higher can be made. Therefore, in the case of the scanning electron microscope of JP-A-63-116348, if the magnification of the optical image is high, the markers may be confirmed. If the magnification of the optical image is varied to a lower magnification, the markers will be reduced in size and so the markers may not be checked. In this way, where markers corresponding to a range of field of view are displayed on an optical image, it is impossible to have a grasp of the imaging positions depending on the magnification of the optical image.

SUMMARY OF THE INVENTION

In view of the foregoing problem, the present invention has been made. One object associated with some aspects of the present invention is to provide a scanning electron microscope and image processing method free of the foregoing problem.

A scanning electron microscope associated with the present invention comprises:

an optical system for irradiating a sample with an electron beam;

a first detector for detecting secondary electrons or backscattered electrons emitted in response to the irradiation of the sample with the electron beam;

a second detector for detecting X-rays or Auger electrons emitted in response to the irradiation of the sample with the electron beam;

a scanning electron microscope (SEM) image generator for generating a scanning electron microscope (SEM) image, based on an output signal from the first detector;

an elemental analyzer for performing elemental analysis based on an output signal from the second detector;

a control section for controlling the optical system, the first detector, and the second detector; and an image processor section for causing first markers indicative of imaging positions and second markers indicative of analysis positions to be displayed on a display device such that the first and second markers are placed on a whole image of the sample.

The image processor section operates (i) to alter the magnification of the whole image based on instructions displayed on the display device for altering the magnification of the whole image, (ii) to cause new first markers of the same size as the first markers placed on the unaltered magnification whole image to be placed on the altered magnification whole image, and (iii) to cause new second markers of the same size as the second markers placed on the unaltered magnification whole image to be placed on the altered magnification whole image.

In this scanning electron microscope, the first and second markers are kept constant in size regardless of variation of the magnification of the whole image and, therefore, the user can get a grasp of the imaging positions and the analysis positions without respect to the magnification of the whole image.

Another scanning electron microscope associated with the present invention comprises:

an optical system for irradiating a sample with an electron beam;

a detector for detecting secondary electrons or backscattered electrons emitted in response to the irradiation of the sample with the electron beam;

a scanning electron microscope (SEM) image generator for generating a scanning electron microscope (SEM) image, based on an output signal from the detector;

a control section for controlling the optical system and the detector; and an image processor section for displaying markers indicative of imaging positions on a display device such that the markers are placed on a whole image of the sample.

The image processor section operates (i) to alter the magnification of the whole image based on instructions displayed on the display device for altering the magnification of the whole image and (ii) to cause new markers of the same size and configuration as the markers placed on the unaltered magnification whole image to be placed on the altered magnification whole image.

In this scanning electron microscope, the markers are not varied in size if the magnification of the whole image is altered. Therefore, one can get a grasp of the imaging positions without respect to the magnification of the whole image.

An image processing method associated with the present invention is for use in a scanning electron microscope having an optical system for irradiating a sample with an electron beam, a detector for detecting secondary electrons or backscattered electrons emitted in response to the irradiation of the sample with the electron beam, a scanning electron microscope (SEM) image generator for generating a scanning electron microscope (SEM) image, based on an output signal from the detector, and a control section for controlling the optical system and the detector.

This image processing method starts with displaying markers indicative of imaging positions on a display device such that the markers are placed on a whole image of the sample. The magnification of the whole image is altered based on instructions displayed on the display device for altering the magnification of the whole image. New markers of the same size and configuration as the markers placed on the unaltered magnification whole image are placed on the altered magnification whole image.

In this image processing method, if the magnification of the whole image is altered, the markers do not change in size. Therefore, one can get a grasp of the imaging positions without relying on the magnification of the whole image.

DESCRIPTION OF THE INVENTION

Non-limiting embodiments of the present invention are hereinafter described in detail with reference to the drawings. It is to be understood that the embodiments described below are not intended to unduly restrict the content of the present invention delineated by the appended claims and that not all the configurations described below are essential constituent components of the invention.

1. SCANNING ELECTRON MICROSCOPE

Figure 1:
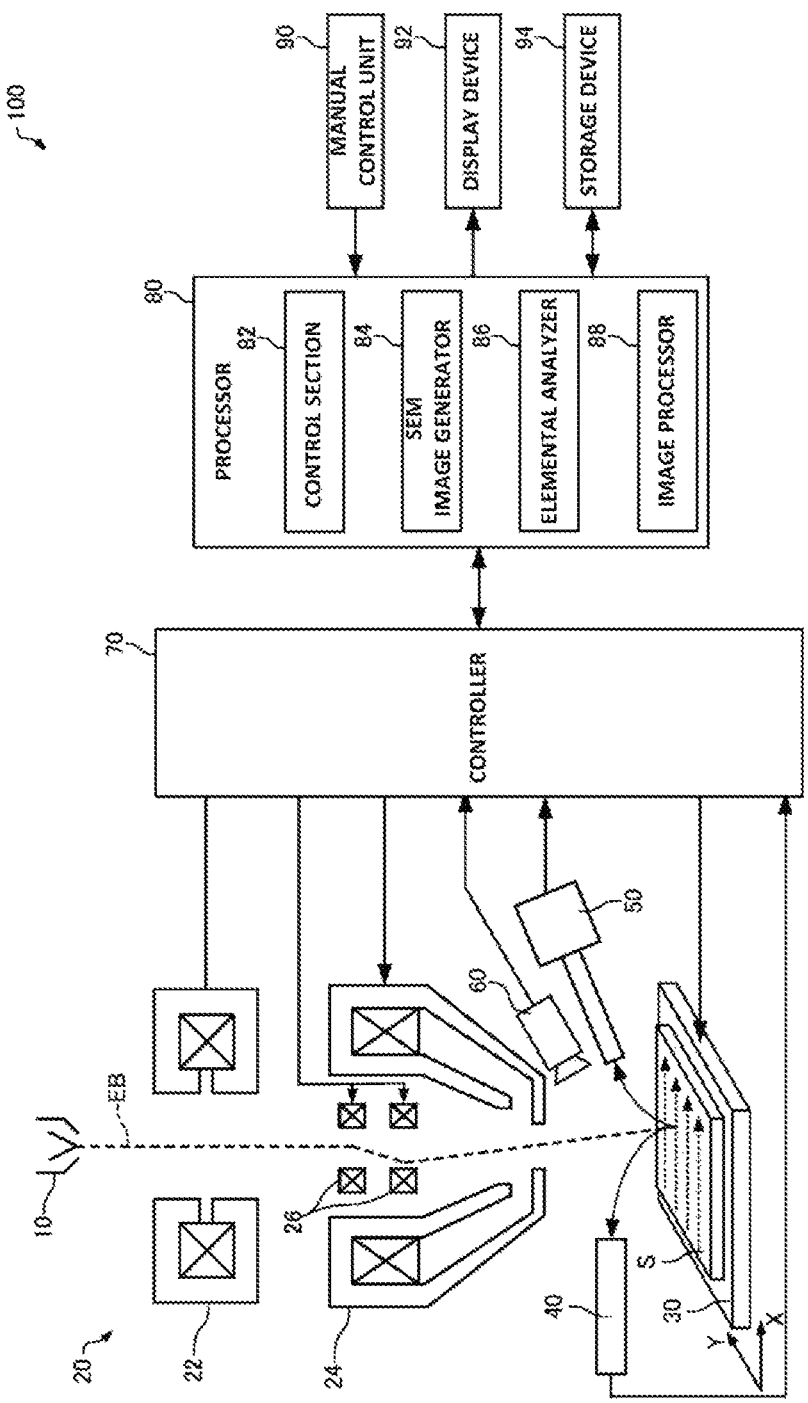
FIG. 1 is a block diagram illustrating the configuration of a scanning electron microscope associated with one embodiment of the present invention.

A scanning electron microscope associated with one embodiment of the present invention is first described by referring to the drawings. FIG. 1 shows the configuration of the scanning electron microscope, 100, associated with the present embodiment. As shown in FIG. 1, the scanning electron microscope 100 includes an electron source 10, an optical system 20, a sample stage 30, an electron detector 40 (one example of a first detector), an X-ray detector 50 (one example of a second detector), an optical imaging device 60, a controller 70 (made of a control computer), a processor 80, a manual control unit 90, a display device 92, and a storage device 94.

The electron source 10 produces electrons. For example, the electron source 10 is an electron gun that emits an electron beam EB by accelerating electrons, which are emitted from a cathode, by means of an anode.

The electron beam EB emitted from the electron source 10 is made to impinge on a sample S by the optical system 20. The optical system 20 includes condenser lenses 22, an objective lens 24, and beam deflectors 26.

The electron beam EB emitted from the electron source 10 is focused by the condenser lenses 22. For example, the diameter and dose of the electron beam EB can be controlled by the condenser lenses 22.

The objective lens 24 is disposed immediately ahead of the sample S and operates to focus the electron beam EB. The objective lens 24 is configured, for example, including coils and a yoke. In the objective lens 24, lines of magnetic force generated by the coils are confined in the yoke made of a material having a high magnetic permeability such as iron. A cutout (lens gap) is formed in a part of the yoke to permit the lines of magnetic force distributed at high density to leak onto the optical axis.

The beam deflectors 26 deflect the electron beam EB in two dimensions. The deflectors 26 allow the electron beam EB to be scanned over the sample S.

The sample S is placed on the sample stage 30, which can hold the sample S. For example, the sample S is held to a sample holder (not shown) and placed on the sample stage 30. The sample stage 30 is configured including a moving mechanism for moving the sample S. By moving the sample S by the sample stage 30, the position on the sample S hit by the electron beam EB can be moved.

The electron detector 40 is a secondary electron detector, for example, which detects secondary electrons emitted from the sample S in response to impingement of the electron beam EB on the sample S. The electron detector 40 produces an output signal which is sent to the controller 70. In the controller 70, the output signal from the electron detector 40 is correlated to information about the position of impingement of the electron beam EB identified by the scan signal. Consequently, image data for generating a secondary electron image (one example of SEM image) can be derived. Alternatively, the electron detector 40 may be a backscattered electron detector for detecting backscattered electrons emitted from the sample S. In this case, image data for generating a backscattered electron image (one example of SEM image) can be obtained.

The X-ray detector 50 detects X-rays emitted from the sample S when the electron beam EB impinges on the sample S. For example, the X-ray detector 50 is an energy dispersive X-ray spectrometer (EDS). Alternatively, the X-ray detector 50 may be a wavelength dispersive X-ray spectrometer (WDS). The X-ray detector 50 produces an output signal that is sent to the controller 70.

The optical imaging device 60 captures optical images of the sample S. For example, the optical imaging device 60 is a digital camera (e.g., CCD (charge coupled device) camera or CMOS (complementary metal-oxide-semiconductor) camera). Alternatively, the optical imaging device 60 may be an optical microscope equipped with a digital camera, for example. The optical imaging device 60 sends the captured optical images (image data) to the controller 70.

Based on control information from a control section 82, the controller 70 supplies control signals to control various components (e.g., the sample stage 30, electron detector 40, X-ray detector 50, and optical imaging device 60) of the scanning electron microscope 100, for controlling lens currents, scan signals, and other factors.

For example, in a case where control information for capturing SEM images is output from the control section 82, the controller 70 supplies scan signals to the beam deflectors 26 such that the electron beam EB is scanned at the imaging position specified by the control information. Consequently, the electron beam EB is scanned at the specified imaging position on the sample S. Secondary electrons or backscattered electrons emitted from the sample S are detected by the electron detector 40, whereby SEM images can be captured.

In a case where control information for a point analysis is output from the control section 82, the controller 70 controls the beam deflectors 26 such that the electron beam EB impinges at the analysis position specified by the control information. In consequence, the electron beam EB is made to impinge at the specified analysis position on the sample S. X-rays emitted from the sample S are detected by the X-ray detector 50. As a result, an EDS spectrum representing analysis results can be obtained.

The controller 70 performs processing to convert the output signal from the electron detector 40 into a signal form (image data) that can be read by the processor 80. Furthermore, the controller 70 performs processing to convert the output signal from the X-ray detector 50 into a signal form that can be read by the processor 80. In addition, the controller 70 performs processing to send the optical images (image data) from the optical imaging device 60 to the processor 80.

The manual control unit 90 performs processing to convert instructions from the user into a control signal and to send it to the processor 80. The manual control unit 90 can be implemented, for example, by an input device such as buttons, keys, touch panel display, microphone, or the like. The manual control unit 90 can accept input of instructions, for example, for altering the magnification of the whole image of the sample S. Furthermore, the manual control unit 90 can accept input, for example, of the imaging position of an SEM image and the analysis positions of elemental analysis.

The display device 92 outputs the image generated by the processor 80. The display device 92 can be realized, for example, by an LCD (liquid crystal display) or other display unit.

Programs and data permitting the processor 80 to perform various computational operations and various control operations are stored in the storage device 94. The storage device 94 is also used as a working area for the processor 80. The storage device 94 can be realized, for example, by a RAM (random access memory), a ROM (read only memory), a hard disk, or the like.

The processor 80 performs processing operations including operations for controlling various portions of the scanning electron microscope 100, operations for generating SEM images, operations for performing elemental analysis, and operations for generating images or graphical objects representing imaging positions and analysis positions. The functions of the processor 80 can be implemented by executing computer programs using various processors (e.g., central processing units (CPUs)). The processor 80 includes the control section 82, an SEM image generator 84, an elemental analyzer 86, and an image processor section 88.

The control section 82 controls various portions of the scanning electron microscope 100. The control section 82 generates control information for controlling various portions of the microscope 100, for example, based on a control signal from the manual control unit 90. For example, if a user enters instructions for specifying the magnification of the whole image 602 via the manual control unit 90, the control section 82 generates control information in response to the instructions. Furthermore, if the user enters instructions for specifying an imaging position or analysis positions via the manual control unit 90, the control section 82 generates control information in response to the instructions. When the user enters other instructions via the manual control unit 90, the control section 82 similarly generates control information in response to the instructions.

The SEM image generator 84 generates an SEM image based on the output signal from the electron detector 40 that represents image data. The elemental analyzer 86 performs elemental analysis, based on the output signal from the X-ray detector 50. For example, when a point analysis is performed, the elemental analyzer 86 generates an EDS spectrum. When a line analysis is performed, the elemental analyzer 86 generates a line profile. When an area analysis is performed, the elemental analyzer 86 generates an elemental map.

The image processor section 88 displays the first markers and second markers indicative of imaging positions and analysis positions, respectively, on the display device 92 in such a way that the first and second markers are placed on the whole image of the sample S.

When instructions for altering the magnification of the whole image of the sample S displayed on the display device 92 are entered, the image processor section 88 alters the magnification of the whole image based on the instructions and causes new first markers of the same size as the first markers placed on the unaltered magnification whole image to be placed on the altered magnification whole image. Similarly, the image processor section 88 causes new second markers of the same size as the second markers placed on the unaltered magnification whole image to be placed on the altered magnification whole image.

Furthermore, the image processor section 88 acquires first control information indicating imaging condition from the control section 82 and varies the color of the first markers based on the first control information. Additionally, the image processor section 88 acquires second control information indicating the condition of elemental analysis from the control section 82 and varies the color of the second markers based on the second control information.

2. TECHNIQUE

Figure 2:
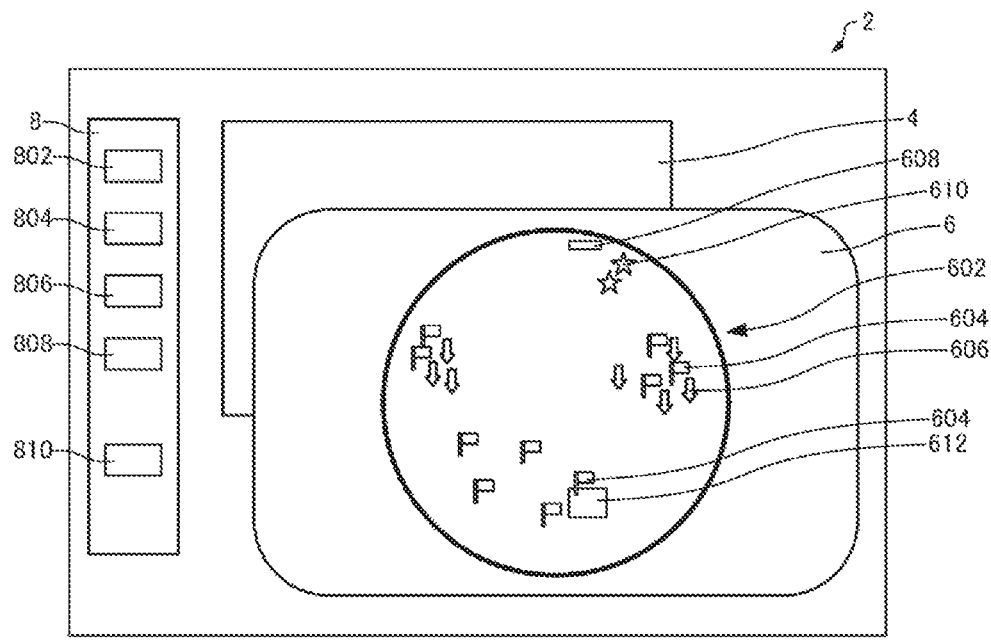
FIG. 2 illustrates one example of GUI (graphical user interface) screen displayed on the display device.

The technique of the present embodiment is next described with reference to some drawings. FIG. 2 illustrates one example of a GUI screen, 2, displayed on the display device 92. As shown in FIG. 2, the GUI screen 2 includes an SEM display window 4 used for observation purposes, a whole image display window 6, and a control window 8.

An SEM image 612 taken by the scanning electron microscope 100 is displayed in the SEM image display window 4. A substantially whole image 602 of the sample S is displayed in the whole image display window 6. Imaging positions at which the SEM image 612 is taken and analysis positions at which elemental analysis is performed using the X-ray detector 50 are displayed on the whole image of the sample S.

The substantially whole image 602 of the sample S is an optical image of the sample S, for example, taken by the optical imaging device 60 and includes the whole of the sample S, for example. Alternatively, the substantially whole image 602 of the sample S may be an image of a part of the sample S and encompass the whole area subjected to imaging or elemental analysis.

First markers 604, second markers 606, a third marker 608, and fourth markers 610 are displayed and superimposed on the substantially whole image 602 of the sample S.

The first markers 604 indicate the imaging positions of the SEM image 612. In the illustrated example, each first marker 604 assumes the form of a flag but no restriction is imposed on the shape of the first marker 604 as long as it can indicate an imaging position.

The first markers 604 indicative of the imaging positions vary in color according to the imaging conditions. For example, the first markers 604 are colored blue during imaging and colored red after the completion of imaging. The user may set at will the color of the first markers 604 which varies according to imaging conditions. Alternatively, the first markers 604 may blink according to the imaging conditions. For example, the first markers 604 may blink during imaging.

The second markers 606, third marker 608, and fourth markers 610 indicate analysis positions. The second markers 606 indicate positions of a point analysis. The third marker 608 indicates a position of a line analysis. The fourth markers 610 indicate positions of an area analysis. In the illustrated example, the second markers 606 have the shape of an arrow, the third marker 608 has the shape of a rectangle, and the fourth markers 610 have the shape of a star. No restrictions are imposed on the shapes of these markers as long as they can indicate analysis positions. The second markers 606, third marker 608, and fourth markers 610 are different in shape and so it is possible to visually grasp the analysis technique.

The second markers 606 indicating analysis positions vary in color according to analysis conditions. For example, the second markers 606 are displayed in blue prior to an analysis, in yellow during the analysis, and in red after the analysis. The color of the second markers 606 which varies according to the analysis conditions may be set at will by the user. The second markers 606 may blink according to the analysis conditions. For example, the second markers 606 may blink during analysis. The third marker 608 and fourth markers 610 vary in color or blink according to the analysis conditions, in the same manner as the second markers 606.

The taken SEM image 612, for example, is displayed in the substantially whole image 602 of the sample S. The SEM image 612 is displayed at any one imaging position on the whole image 602 of the sample S in a size according to the magnification of the final image.

Where the imaging magnification of the SEM image 612 is higher than the magnification of the whole image 602, the SEM image 612 will shrink to such a size that it cannot be easily visually checked on the whole image 602. In the scanning electron microscope 100, therefore, the imaging positions are indicated using the first markers 604 to permit the operator to confirm the imaging positions regardless of the final magnification of the SEM image 612.

Figure 3:
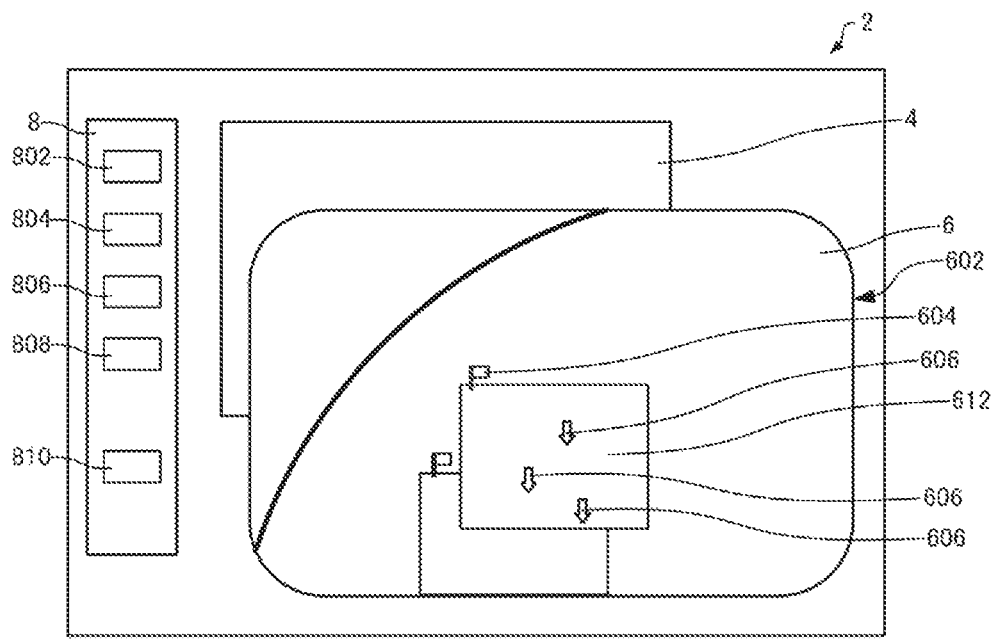
FIG. 3 illustrates another example of GUI screen displayed on the display device.

FIG. 3 illustrates one example of GUI screen, 2, displayed on the display device 92. FIG. 3 illustrates the manner in which the substantially whole image 602 of the sample S is enlarged from the state shown in FIG. 2.

When the user enters instructions for altering the magnification of the whole image 602 through the manual control unit 90, the magnification of the whole image 602 is altered based on the instructions. In the example shown in FIG. 3, instructions for increasing the magnification of the whole image 602 are entered and so the whole image 602 is enlarged. Variation of the magnification of the whole image 602 is carried out, for example, by digital zooming.

If the magnification of the whole image 602 is altered, the first markers 604 and the second markers 606 do not vary in size. Similarly, the third marker 608 and the fourth markers 610 do not vary in size if the magnification of the whole image 602 is altered, in a manner not illustrated.

A coordinate system for the whole image 602 of the sample S and a coordinate system for the sample stage 30 are interrelated. That is, on the whole image 602 of the sample S, the coordinates of the sample stage 30 can be uniquely determined from the coordinates of an arbitrary position to which the coordinates of the sample stage 30 correspond. Similarly, the coordinates of sample S on the whole image 602 can be uniquely determined from the coordinates of an arbitrary position on the sample stage 30 to which the former coordinates correspond.

GUI elements (such as buttons, icons, or the like) for control and manipulation of the scanning electron microscope 100 are displayed in the control window 8. In particular, what are displayed in the control window 8 are an Imaging button 802, a Point analysis button 804, a Line analysis button 806, an Area analysis button 808, and a Start button 810. Other GUI elements for control and manipulation of the microscope 100 may also be displayed in the control window 8.

The Imaging button 802 is a button for taking the SEM image 612. The SEM image 612 can be taken by moving the sample stage 30 to search for a desired field of view and depressing the Imaging button 802 at a desired position on the sample S.

The Point analysis button 804 is used to perform a point analysis. An analysis position where a point analysis is performed can be specified by specifying a position on the whole image 602 of the sample S while the Point analysis button 804 is selected and activated.

The Line analysis button 806 is used to perform a line analysis. An analysis position where a line analysis is performed can be specified by specifying a position on the whole image 602 of the sample S while the Line analysis button 806 is selected and activated.

The Area analysis button 808 is used to perform an area analysis. An analysis position where an area analysis is performed can be specified by specifying positions or an area on the whole image 602 of the sample S while the Area analysis button 808 is selected and activated.

The Start button 810 is used to start an analysis. For example, if the Start button 810 is depressed while an analysis position where a point analysis is performed is specified, the point analysis is initiated at the specified analysis position.

FIGS. 4-10 illustrate the GUI screens 2.

(1) Taking of Whole Image of Sample

Figure 4:
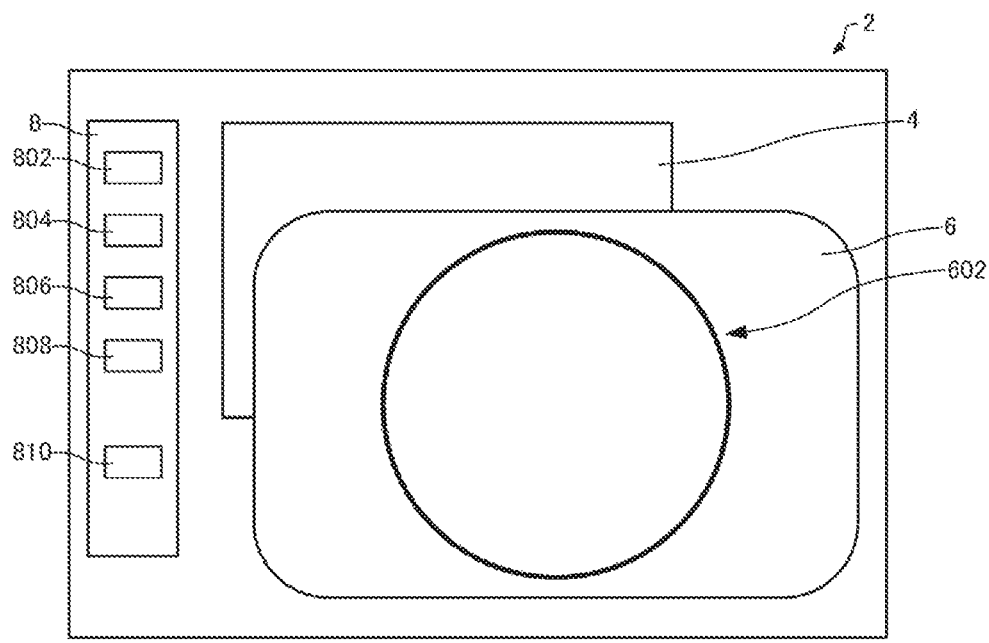
FIGS. 4-9 illustrate GUI screens.

When a user enters instructions for taking the substantially whole image 602 of the sample S through the manual control unit 90, the optical imaging device 60 takes the whole image 602 of the sample S. The taken whole image 602 of the sample S is displayed in the whole image display window 6 as shown in FIG. 4. The user can determine an imaging position and analysis positions, for example, by viewing the whole image 602 of the sample S displayed in the whole image display window 6.

(2) Taking of SEM Image

Figure 5:
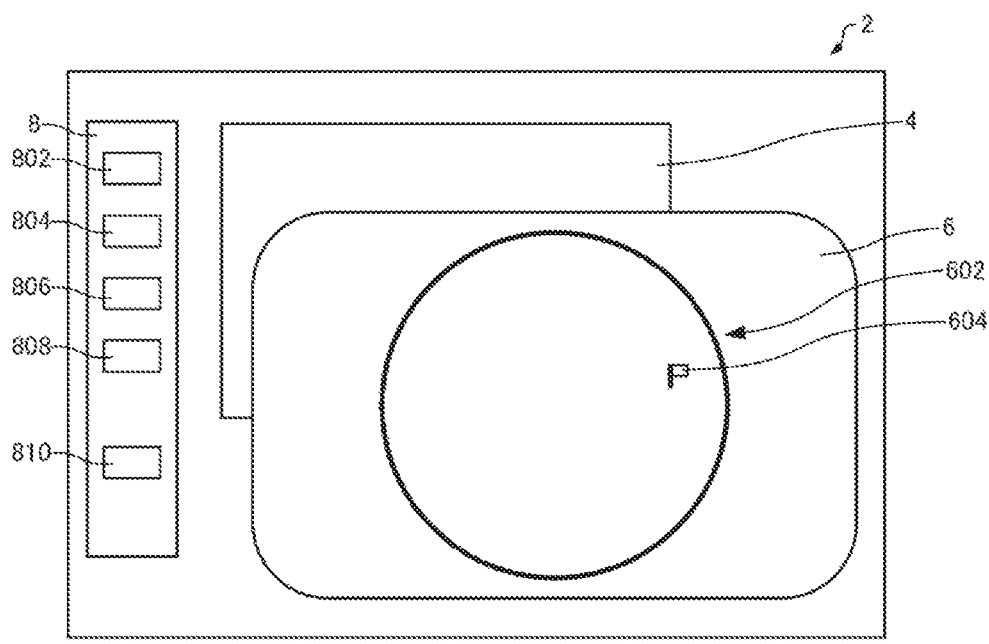

When the user determines an imaging position and enters instructions for taking the SEM image 612 through the manual control unit 90, the SEM image 612 is taken and stored in the storage device 94. As shown in FIG. 5, the first marker 604 indicative of the imaging position is shown and overlaid on the whole image 602 displayed in the whole image display window 6. During imaging the first marker 604 is displayed in blue color and after the imaging the first marker 604 is displayed in red color, for example.

(3) Specification of Analysis Positions

Figure 6:
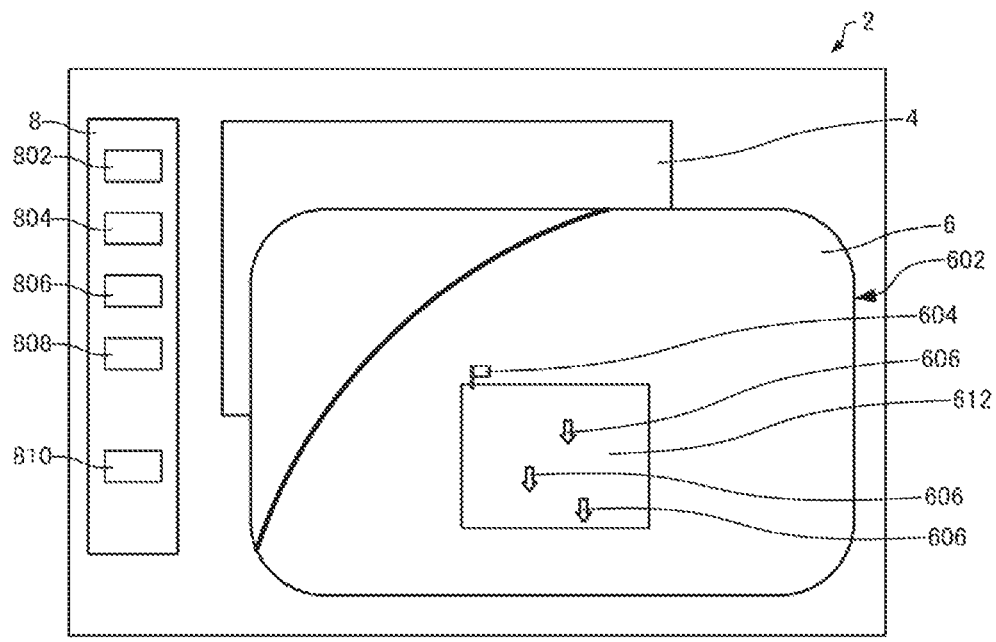

The user can search the whole image 602 displayed in the whole image display window 6 for a desired position at which an analysis is to be performed. As shown in FIG. 6, the whole image 602 can be enlarged. The SEM image 612 is enlarged and shown on the whole image 602 by enlarging the whole image 602 such that the imaging position indicated by the first marker 604 is contained within the field of view.

As shown in FIG. 6, although the whole image 602 of the sample S is enlarged as compared to the whole image 602 of the sample S shown in FIG. 5, the first marker 604 shown in FIG. 6 and the first marker 604 shown in FIG. 5 are of the same size.

When the user enters instructions for specifying analysis positions on the taken SEM image 612 through the manual control unit 90, the second markers 606 indicative of the analysis positions are placed on the SEM image 612 as shown in FIG. 6. In the example shown in FIG. 6, three analysis positions are specified and three second markers 606 are displayed. The second markers 606 are displayed in blue color prior to an analysis, displayed in yellow color during the analysis, and displayed in red color after the analysis, for example.

(4) Analysis

When the user enters instructions for starting an analysis through the manual control unit 90, a point analysis is performed at each of the analysis positions indicated by the second markers 606. As a result, an EDS spectrum 614 (see FIG. 8) is obtained and stored in the storage device 94.

As described above, the SEM image 612 is taken and the point analysis is performed. The first markers 604, the second markers 606, the SEM image 612, and so on are displayed and superimposed on the whole image 602 of the sample S displayed in the whole image display window 6. Accordingly, one can confirm the imaging positions and analysis positions by viewing the whole image display window 6. Line analysis and area analysis can be carried out in the same manner as the point analysis and so a description thereof is omitted.

(5) Display of Imaging Results and Analysis Results

Figure 7:
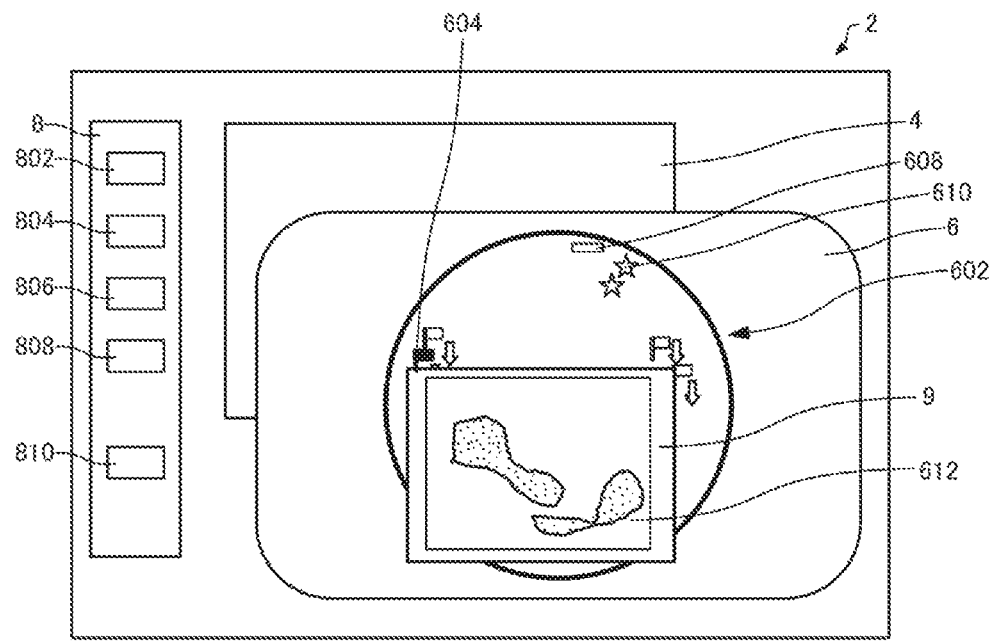

As shown in FIG. 7, when the user selects the first marker 604 indicative of a desired imaging position through the manual control unit 90, a result display window 9 is displayed close to the selected first marker 604. The imaging position is selected, for example, by clicking the first marker 604 with a mouse cursor or tapping the first marker 604 on a touch panel. The SEM image 612 taken at the imaging position indicated by the selected first marker 604 is displayed in the result display window 9. Furthermore, imaging conditions and so on may be displayed in the result display window 9 in a manner not illustrated.

Figure 8:
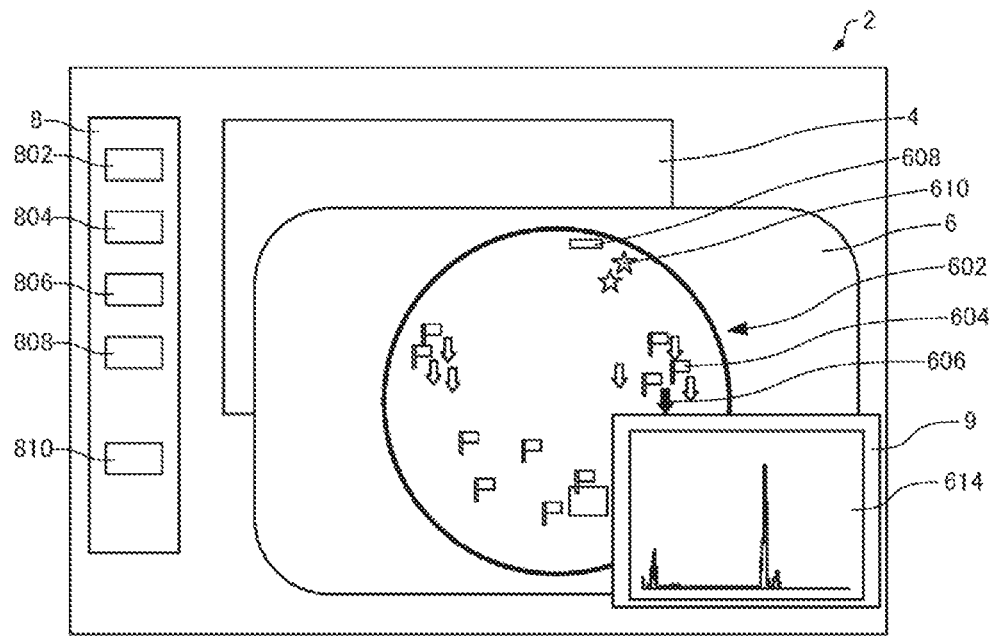

As shown in FIG. 8, when the user selects one second marker 606 indicative of an analysis position through the manual control unit 90, the result display window 9 is displayed near the selected second marker 606. The selection of the analysis position is done in the same way as the selection of the imaging position. The results of the analysis at the analysis position indicated by the selected second marker 606 are displayed in the result display window 9. In the example shown in FIG. 8, the results of a point analysis at the analysis position indicated by the selected second marker 606, i.e., the EDS spectrum 614, are shown. In addition, analysis conditions, an SEM image at the analysis position, and other parameters may be displayed in the result display window 9 in a manner not illustrated.

Figure 9:
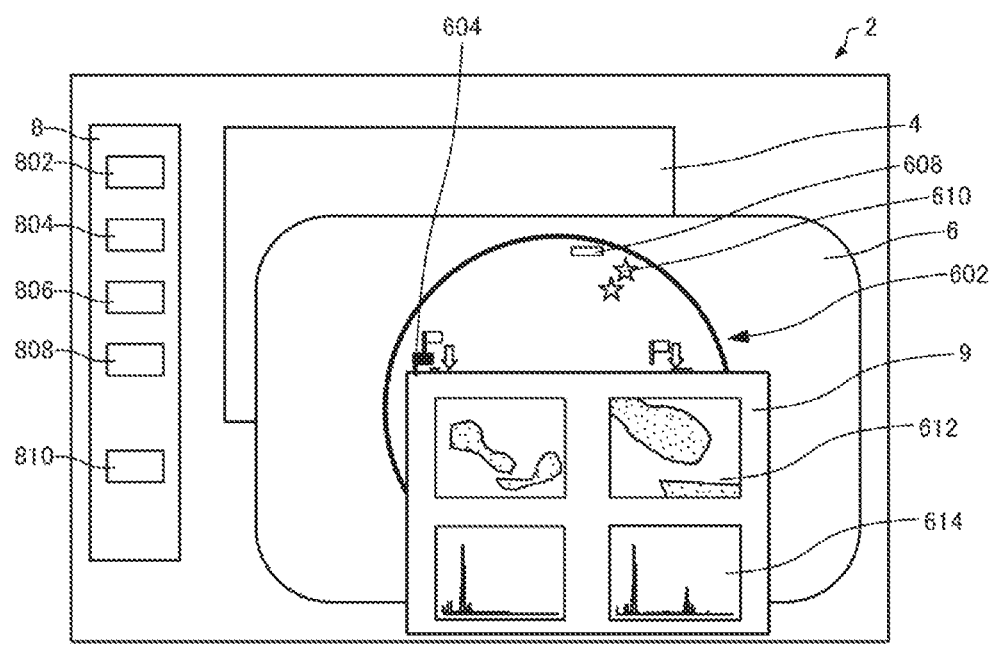
Figure 10:
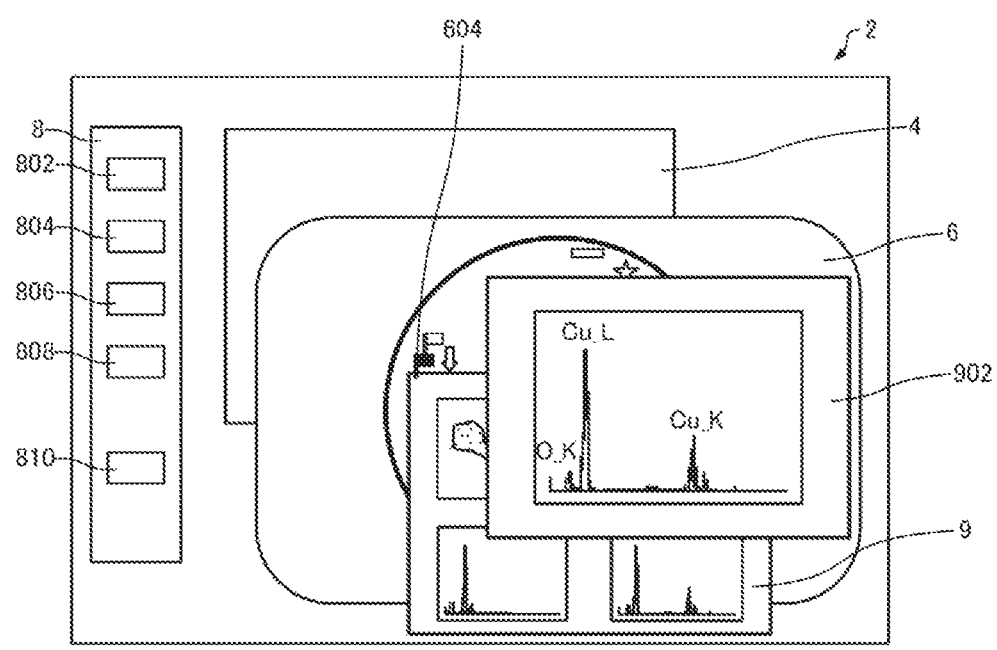
FIG. 10 illustrates manipulations using a GUI screen.

When plural imaging operations and plural analyses are performed at the same position, if the marker located at this same position is selected, plural SEM images 612 and plural EDS spectra 614 are displayed in the result display window 9 as shown in FIG. 9. If one of the imaging results and analysis results displayed in the single result display windows 9 is selected, a detail display window 902 for showing analysis results in detail is displayed as shown in FIG. 10. Length measurement, spectral analysis, editing of an elemental map, and so on can be done in the detail display window 902.

3. PROCESSING

The processing performed by the processor 80 is next described.

(1) Display of Whole Image of Sample

When the whole image 602 of the sample S is taken using the optical imaging device 60, the image processor section 88 displays the whole image 602 of the sample S in the whole image display window 6 as shown in FIG. 4.

(2) Taking of SEM Image

The control section 82 controls the optical system 20 and the electron detector 40 based on a control signal from the manual control unit 90 to take the SEM image 612. In particular, the control section 82 controls the beam deflectors 26 to scan the sample S with the electron beam EB. Consequently, secondary electrons or backscattered electrons emitted from the sample S are detected by the electron detector 40. In this way, it is possible to take the SEM image 612.

The image processor section 88 acquires information about the imaging position from the control section 82 and places and displays the first marker 604 on the whole image 602 of the sample S so as to correspond to the imaging position on the basis of the imaging position information (see FIG. 5). At this time, the image processor section 88 acquires control information indicating that it is during imaging from the control section 82 and displays the first marker 604 in a color representing "during imaging" based on the control information.

When the taking of the SEM image 612 is completed, the SEM image 612 is stored in the storage device 94. The image processor section 88 displays the first marker 604 placed on the whole image 602 in a color representing "completion of imaging" based on control information indicating that taking of the SEM image 612 is finished.

(3) Display of Analysis Positions

When the user enters instructions for specifying analysis positions through the manual control unit 90, the image processor section 88 displays and places the second markers 606 on the whole image 602 of the sample S corresponding to the analysis positions on the basis of the entered information about the analysis positions (see FIG. 6). At this time, the image processor section 88 acquires control information indicating that it is "prior to analysis" from the control section 82 and displays the second markers 606 in a color indicating "prior to analysis" based on the control information.

(4) Analysis

The control section 82 controls the optical system 20 and the X-ray detector 50 such that elemental analysis is performed at each of the analysis positions indicated by the second markers 606. In particular, the control section 82 controls the beam deflectors 26 such that the electron beam EB impinges at the analysis positions indicated by the second markers 606. Consequently, the X-rays emitted from the sample S are detected by the X-ray detector 50. In this way, an EDS spectrum 614 can be obtained.

When a point analysis at each analysis position is initiated, the image processor section 88 obtains control information indicating start of an analysis from the control section 82 and displays the second markers 606 placed on the whole image 602 in a color denoting "during analysis" based on the control information.

When the analysis at the analysis position ends, the EDS spectrum 614 is stored in the storage device 94. The imager processor section 88 acquires control information indicating that the analysis has ended from the control section 82 and represents the second markers 606 placed on the whole image 602 in a color denoting "already analyzed" based on the control information.

(5) Display of Imaging Results and Analysis Results

When the user selects the first marker 604 indicative of the imaging position through the manual control unit 90, the image processor section 88 displays the result display window 9 near the selected first marker 604 in response to a control signal from the manual control unit 90 (see FIG. 7) and causes the SEM image 612 taken at the imaging position indicated by the selected first marker 604 to be displayed in the result display window 9.

When the user selects one second marker 606 indicative of an analysis position through the manual control unit 90, the image processor section 88 displays the result display window 9 near the selected second marker 606 in response to a control signal from the manual control unit 90 as shown in FIG. 8 and causes the results of the analysis (EDS spectrum 614) at the analysis position indicated by the selected second marker 606 to be displayed in the result display window 9.

When plural imaging operations and plural analyses are conducted at the same position, if the marker placed at this same position is selected, the image processor section 88 displays the result display window 9 near the selected marker in response to a control signal from the manual control unit 90. At this time, the image processor section 88 displays plural SEM images 612 and plural EDS spectra 614 in the result display window 9 as shown in FIG. 9. If one of the plural imaging results and plural analysis results displayed in the single display window 9 is selected, the image processor section 88 displays the detail display window 902 for showing details of the analysis results in response to a control signal from the manual control unit 90.

4. FEATURES

The scanning electron microscope 100 has the following features. In the scanning electron microscope 100, the image processor section 88 alters the magnification of the whole image 602 based on instructions for altering the magnification of the whole image 602 of the sample S displayed on the display device 92 and displays new first markers 604 of the same size as the first markers 604 placed on the unaltered magnification whole image 602 such that the new first markers 604 are placed on the altered magnification whole image 602. Therefore, in the scanning electron microscope 100, if the magnification of the whole image 602 is altered, the first markers 604 do not vary in size. Consequently, it is possible to grasp the imaging position without relying on the magnification of the whole image 602.

Furthermore, in the scanning electron microscope 100, the image processor section 88 alters the magnification of the whole image 602 based on instructions for altering the magnification of the whole image 602 of the sample S displayed on the display device 92 and displays new second markers 606 of the same size as the second markers 606 placed on the unaltered magnification whole image 602 such that the new second markers 606 are placed on the altered magnification whole image 602. Therefore, in the scanning electron microscope 100, if the magnification of the whole image 602 is altered, the second markers 606 remain constant in size. Hence, it is possible to grasp the analysis positions without reliance on the magnification of the whole image 602.

In the scanning electron microscope 100, the image processor section 88 acquires first control information indicating imaging conditions from the control section 82 and alters the color of the first markers 604 based on the first control information. Therefore, in the scanning electron microscope 100, it is possible to easily grasp the imaging conditions.

In the scanning electron microscope 100, the image processor section 88 blinks the first markers 604 based on the first control information. Therefore, in the scanning electron microscope 100, it is easy to grasp the imaging conditions.

In the scanning electron microscope 100, the first control information indicates that it is "during imaging" or "already imaged". Therefore, in the scanning electron microscope 100, it is possible to grasp whether the imaging position indicated by each first marker 604 is being imaged or already imaged.

In the scanning electron microscope 100, the image processor section 88 obtains second control information indicating the state of an elemental analysis from the control section 82 and alters the color of the second markers 606 based on the second control information. Therefore, in the scanning electron microscope 100, it is easy to grasp the state of the elemental analysis.

In the scanning electron microscope 100, the image processor section 88 blinks the second markers 606 based on the second control information. Therefore, in the scanning electron microscope 100, the state of the elemental analysis can be grasped easily.

In the scanning electron microscope 100, the second control information indicates "prior to analysis", "during analysis", or "completion of analysis". Therefore, in the scanning electron microscope 100, the user can grasp in which one of the states "prior to analysis", "during analysis", and "completion of analysis" is each of the imaging positions indicated by the second markers 606.

The scanning electron microscope 100 includes the optical imaging device 60 for optically imaging the sample S. The whole image 602 of the sample S is an image of the sample S captured by the optical imaging device 60. Therefore, in the scanning electron microscope 100, imaging positions and analysis positions can be indicated on an optical image of the sample S.

In the scanning electron microscope 100, if one first marker 604 placed on the whole image 602 of the sample S is selected, the image processor section 88 causes the results of imaging done at the imaging position indicated by the first marker 604 to be displayed on the display device 92. Therefore, in the scanning electron microscope 100, the imaging position and the SEM image 612 taken at this imaging position can be intercorrelated.

In the scanning electron microscope 100, if one of the second markers 606 placed on the whole image 602 of the sample S is selected, the image processor section 88 causes the results of the analysis at the analysis position indicated by the second marker 606 to be displayed on the display device 92. Therefore, in the scanning electron microscope 100, the analysis position and the results of the analysis at this analysis position can be intercorrelated.

An image processing method associated with the present embodiment involves the steps of: causing the first markers 604 indicative of imaging positions and the second markers 606 indicative of analysis positions to be displayed on the display device 92 such that the first and second markers 604, 606 are placed on the whole image 602 of the sample S; altering the magnification of the whole image 602 based on instructions for altering the magnification of the whole image 602 displayed on the display device 92; and displaying new first markers 604 of the same size as the first markers 604 placed on the unaltered magnification whole image 602 such that the new first markers 604 are placed on the altered magnification whole image 602. The image processing method associated with the present embodiment further includes the step of displaying new second markers 606 of the same size as the second markers 606 placed on the unaltered magnification whole image 602 such that the new second markers 606 are placed on the altered magnification whole image 602.

Therefore, in the image processing method associated with the present embodiment, if the magnification of the whole image 602 is altered, the first markers 604 and second markers 606 remain constant in size and so the imaging positions and analysis positions can be grasped regardless of the magnification of the whole image 602.

5. MODIFIED EMBODIMENTS

It is to be understood that the present invention is not restricted to the above embodiment but rather can be practiced in variously modified forms without departing from the gist of the invention. In the following, only differences with the above-described scanning electron microscope 100 are described; a description of similarities is omitted.

5.1. First Modified Embodiment

Figure 11:
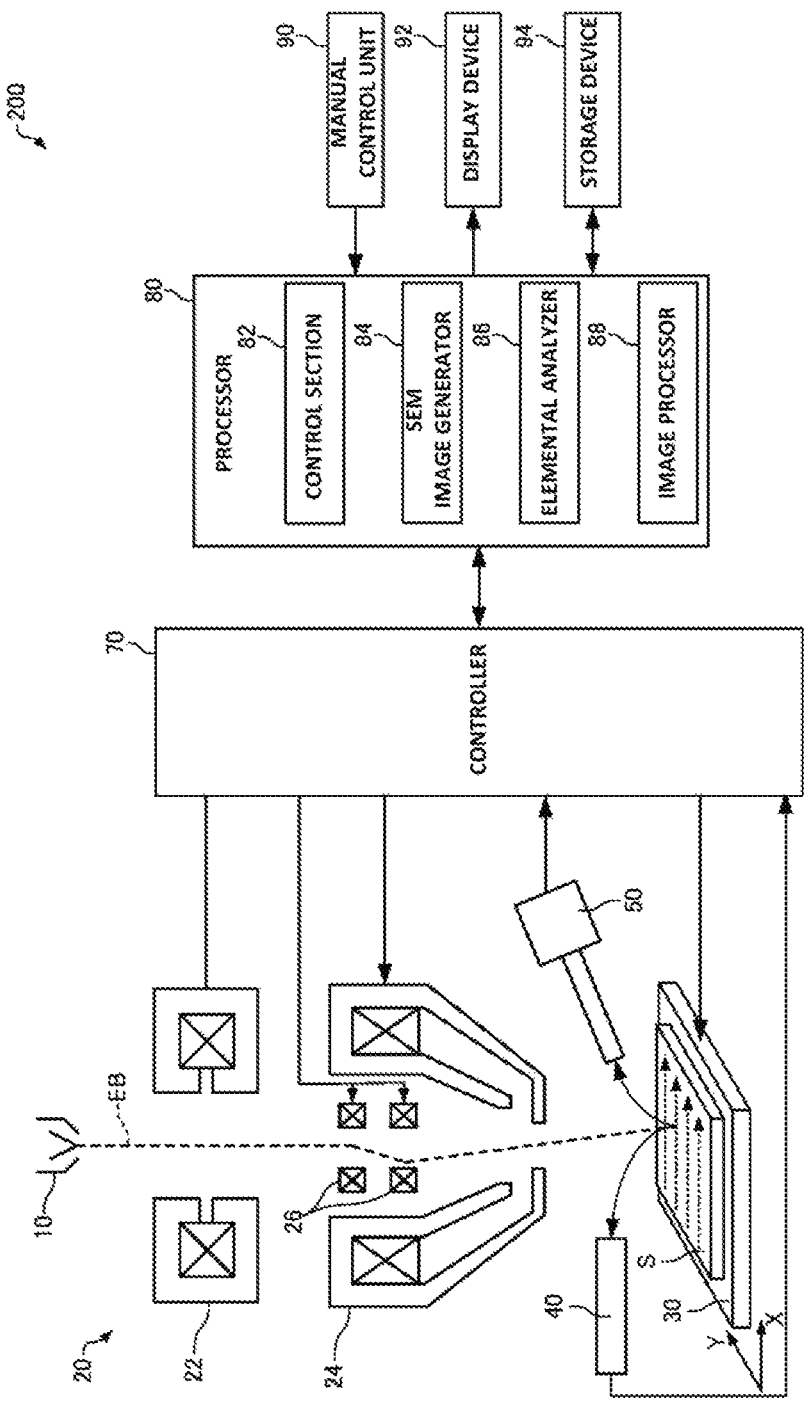
FIG. 11 is a block diagram similar to FIG. 1, but showing the configuration of a scanning electron microscope associated with a first modified embodiment.

FIG. 11 is a diagram showing the configuration of a scanning electron microscope associated with a first modified embodiment. Those members of this microscope, 200, which are similar in function to their respective counterparts of the above-described scanning electron microscope 100 are indicated by the same reference numerals as in the above referenced figures and a detail description thereof is omitted.

The above-described scanning electron microscope 100 has the optical imaging device 60 as shown in FIG. 1. The whole image 602 of the sample S is an optical image of the sample S taken by the optical imaging device 60.

On the other hand, the scanning electron microscope 200 has no optical imaging device as shown in FIG. 11. The whole image 602 of the sample S is a computer graphics image.

Plural computer graphics (CG) images each representative of the whole image 602 of the sample S are stored in the storage device 94 in a corresponding manner to plural sample holders capable of being installed on the sample stage 30. These CG images are images of the sample holders and each represents the whole image 602 of the sample S. The user can select the CG image corresponding to the used sample holder and use it as the whole image 602 of the sample S.

5.2. Second Modified Embodiment

Figure 12:
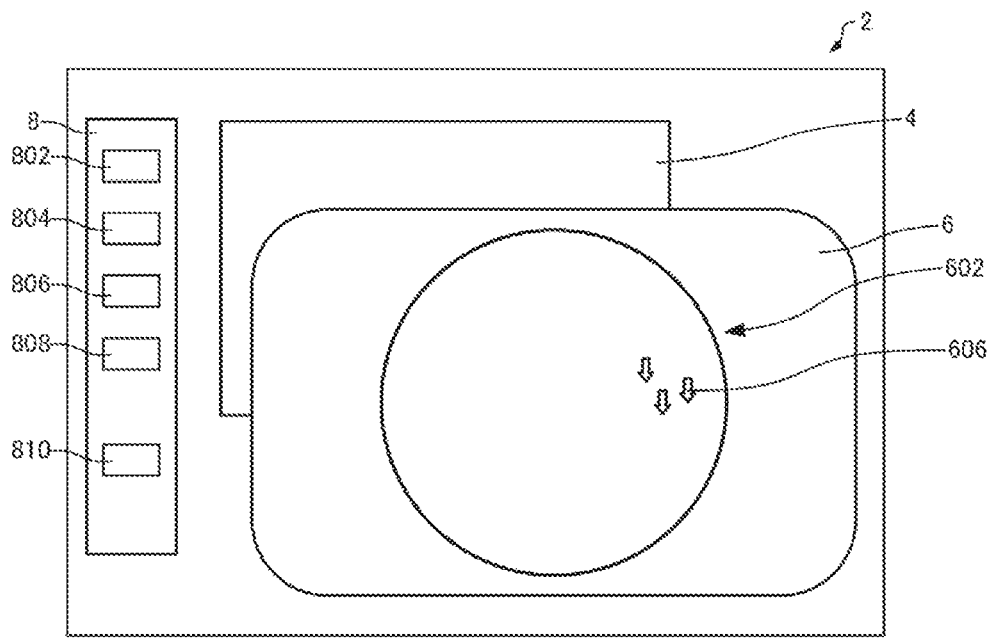
FIGS. 12-15 illustrate GUI screens displayed on the display device shown in FIG. 11.

FIG. 12 illustrates one example of the GUI screen 2 displayed on the display device 92.

With the above-described scanning electron microscope 100, analysis positions are specified on the SEM image 612 as shown in FIG. 3. Alternatively, analysis positions can be specified directly on the whole image 602 of the sample S as shown in FIG. 12. That is, analysis positions can be specified within an area not imaged, i.e., not contributing to the SEM image 612.

For example, the user can specify analysis positions on the whole image 602 of the sample S through the manual control unit 90. Consequently, elemental analysis can be performed by specifying analysis positions without taking the SEM image 612.

5.3. Third Modified Embodiment

Figure 13:
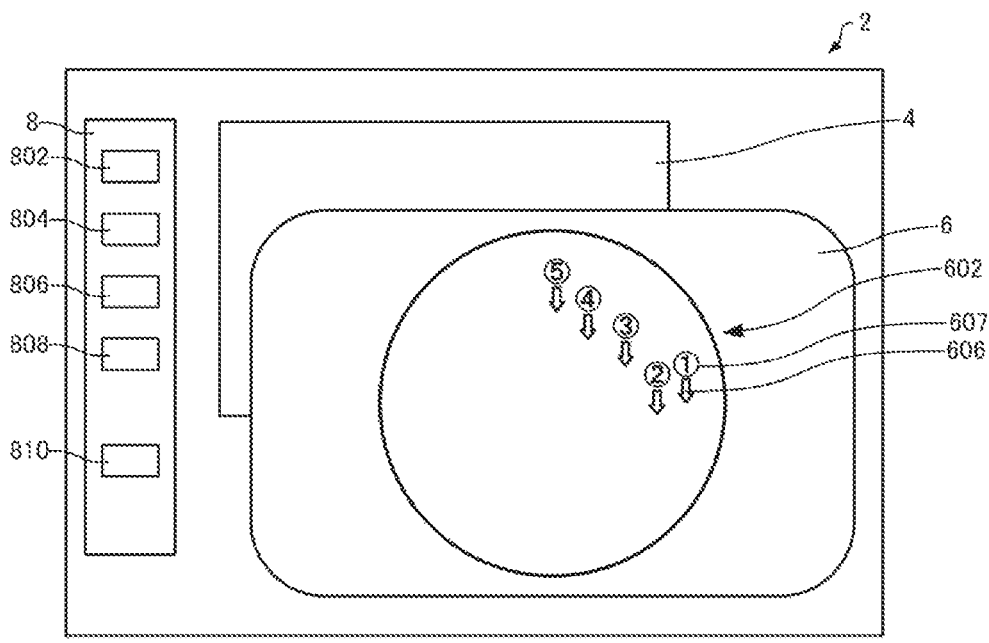

FIG. 13 illustrates one example of the GUI screen 2 displayed on the display device 92. As shown in FIG. 13, when the plural second markers 606 are placed on the whole image 602 of the sample S, the image processor section 88 may operate such that symbols 607 are displayed on the display device 92 and attached to the second markers 606 to indicate an analysis order.

When the user enters an analysis order through the manual control unit 90, the image processor section 88 attaches the symbols 607 indicating the analysis order to the second markers 606 on the display device 92 based on the analysis order specified by the user. In the example shown in FIG. 13, numbers "1", "2", "3", "4", and "5" are attached as the symbols 607 to the five second markers 606, respectively, to denote the analysis order. If the analysis order can be grasped, the symbols 607 are not restricted to the example shown in FIG. 13.

In the third modified embodiment, the image processor section 88 attaches symbols indicative of an analysis order to the plural second markers 606 on the display device 92. Therefore, it is easy to grasp the analysis order.

5.4. Fourth Modified Embodiment

Figure 14:
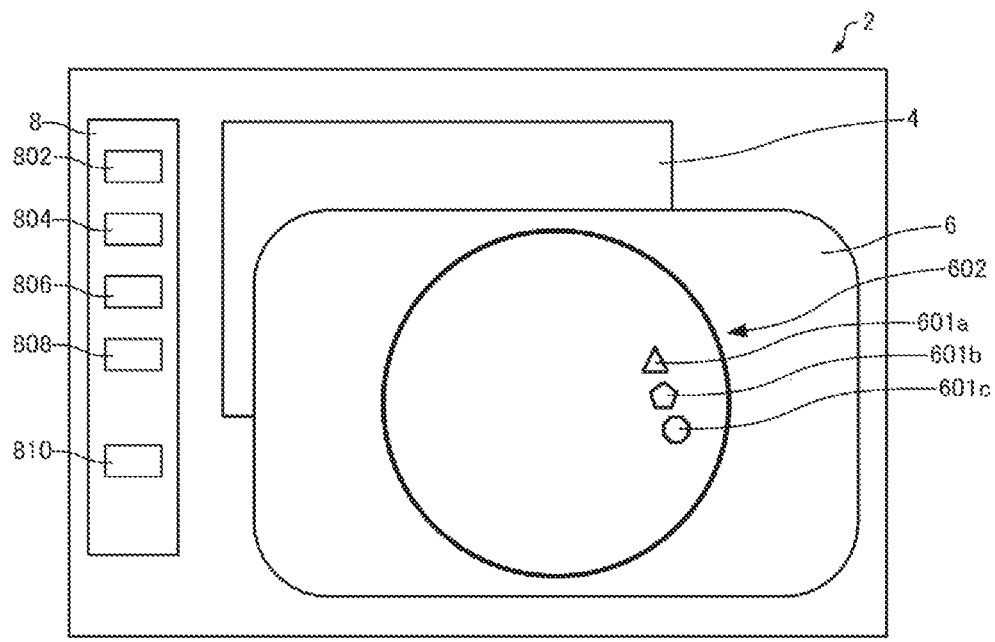

FIG. 14 illustrates one example of the GUI screen 2 displayed on the display device 92. Sometimes, both imaging and analysis are conducted at the same position on the sample S or plural analyses are performed at the same position on the sample S. In a fourth modified embodiment, the shapes of markers disposed on the whole image 602 of the sample S are varied according to the combination of such imaging and analysis. For example, in the example shown in FIG. 14, when imaging and a point analysis are performed at the same position, a triangularly shaped marker 601*a* is placed. When imaging and a line analysis are performed at the same position, a pentagonally shaped marker 601*b* is placed. When imaging, a point analysis, and an area analysis are performed at the same position, an octagonally shaped marker 601*c* is placed.

In the fourth modified embodiment, the image processor section 88 alters the shapes of the markers according to the combination of imaging and analysis. Therefore, it is easy to grasp the combination of imaging and analysis. Alternatively, the image processor section 88 may vary the colors of the markers according to the combination of imaging and analysis. Also, in this case, similar effects can be produced.

5.5. Fifth Modified Embodiment

Figure 15:
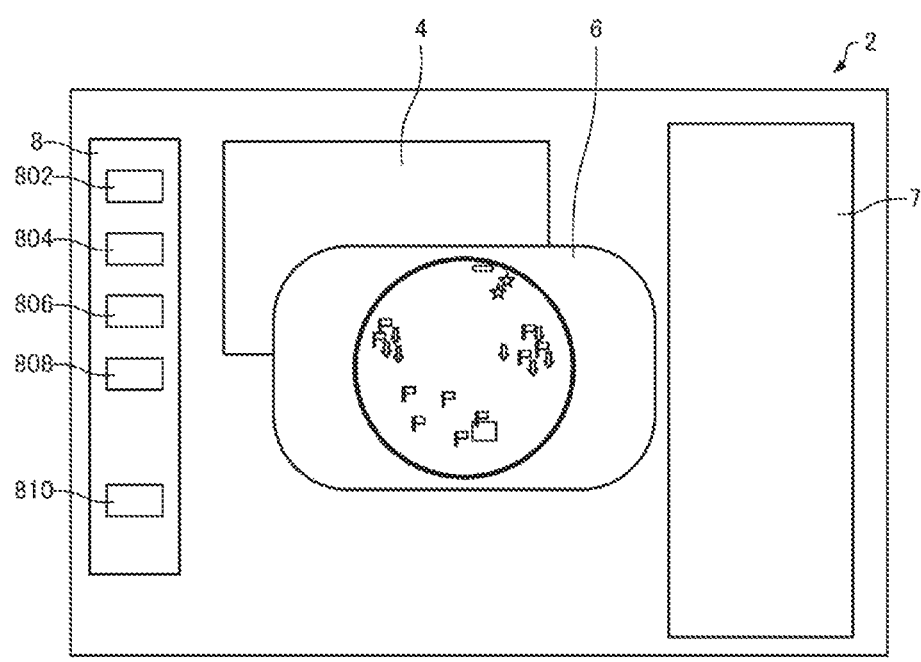

FIG. 15 illustrates one example of the GUI screen 2 displayed on the display device 92. As shown in FIG. 15, the GUI screen 2 can have a history display window 7 for showing histories of imaging operations and analysis operations. In the history display window 7, captured SEM images and analysis results are displayed in a temporal sequence.

In the fifth modified embodiment, the image processor section 88 displays the histories of imaging (SEM imaging) operations and elemental analysis operations on the display device 92. Therefore, it is easy to grasp the histories of imaging and elemental analysis.

5.6. Sixth Modified Embodiment

The above-described scanning electron microscope 100 shown in FIG. 1 has the X-ray detector 50 for performing elemental analysis. A detector for performing elemental analysis is not restricted to this type of device. A scanning electron microscope associated with the present invention can have an Auger electron spectroscopy analyzer as a detector for performing elemental analysis, the Auger electron spectroscopy analyzer operating to detect Auger electrons emitted from the sample S. This arrangement can yield effects similar to those produced by the above-described scanning electron microscope 100 shown in FIG. 1.

It is to be noted that the above embodiments and modifications are merely exemplary and that the invention is not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

The invention claimed is:

1. A scanning electron microscope comprising:
   an optical system for irradiating a sample with an electron beam;
   a first detector for detecting secondary electrons or backscattered electrons emitted in response to the irradiation of the sample with the electron beam;
   a second detector for detecting X-rays or Auger electrons emitted in response to the irradiation of the sample with the electron beam;
   a scanning electron microscope (SEM) image generator for generating a scanning electron microscope (SEM) image, based on an output signal from the first detector;
   an elemental analyzer for performing elemental analysis based on an output signal from the second detector;
   a control section for controlling the optical system, the first detector, and the second detector; and
   an image processor section for causing first markers indicative of imaging positions and second markers indicative of analysis positions to be displayed on a display device such that the first and second markers are placed on a whole image of the sample;
   wherein the image processor section operates to alter a magnification of the whole image based on instructions displayed on the display device for altering the magnification of the whole image to produce an altered magnification whole image, thereby causing new first markers of a same size as the first markers placed on the whole image of the sample to be placed on the altered magnification whole image, and to cause new second markers of a same size as the second markers placed on the whole image of the sample to be placed on the altered magnification whole image.

2. A scanning electron microscope as set forth in claim 1, wherein said image processor section acquires first control information indicating imaging conditions from said control section and alters a color of the first markers based on the first control information.

3. A scanning electron microscope as set forth in claim 2, wherein said image processor section blinks said first markers based on said first control information.

4. A scanning electron microscope as set forth in claim 2, wherein said first control information indicates whether it is during imaging or it is after completion of imaging.

5. A scanning electron microscope as set forth in claim 1, wherein said image processor section acquires second control information indicating conditions of elemental analysis from said control section and alters a color of said second markers based on the second control information.

6. A scanning electron microscope as set forth in claim 5, wherein said image processor section blinks said second markers based on said second control information.

7. A scanning electron microscope as set forth in claim 5, wherein said second control information indicates whether it is prior to analysis, it is during analysis, or it is after completion of analysis.

8. A scanning electron microscope as set forth in claim 1, wherein said second markers are placed on said whole image, and wherein said image processor section operates such that symbols indicative of an analysis order are displayed on the display device and attached to the second markers.

9. A scanning electron microscope as set forth in claim 1, further comprising an optical imaging device for optically imaging said sample, and wherein said whole image is an image of the sample taken by the optical imaging device.

10. A scanning electron microscope as set forth in claim 1, wherein said whole image is a computer graphics image.

11. A scanning electron microscope as set forth in claim 1, wherein, when any one of the first markers placed on said whole image is selected, said image processor section causes results of imaging done at the imaging position indicated by the selected first marker to be displayed on said display device.

12. A scanning electron microscope as set forth in claim 1, wherein, when any one of the second markers placed on said whole image is selected, said image processor section causes results of analysis performed at the analysis position indicated by the selected second marker to be displayed on said display device.

13. A scanning electron microscope as set forth in claim 1, wherein said control section controls said optical system and said second detector to perform analysis at said analysis positions indicated by said second markers.

14. A scanning electron microscope comprising:
   an optical system for irradiating a sample with an electron beam;
   a detector for detecting secondary electrons or backscattered electrons emitted in response to the irradiation of the sample with the electron beam;
   a scanning electron microscope (SEM) image generator for generating a scanning electron microscope (SEM) image, based on an output signal from the detector;

a control section for controlling the optical system and the detector; and an image processor section for displaying markers indicative of imaging positions on a display device such that the markers are placed on a whole image of the sample;

wherein the image processor section operates to alter magnification of the whole image based on instructions displayed on the display device for altering the magnification of the whole image to produce an altered magnification whole image and to cause new markers of a same size and configuration as the markers placed on the whole image to be placed on the altered magnification whole image.

15. An image processing method for use in a scanning electron microscope having an optical system for irradiating a sample with an electron beam, a detector for detecting secondary electrons or backscattered electron emitted in response to the irradiation of the sample with the electron beam, a scanning electron microscope (SEM) image generator for generating a scanning electron microscope (SEM) image, based on an output signal from the detector, and a control section for controlling the optical system and the detector, said image processing method comprising the steps of:

displaying markers indicative of imaging positions on a display device such that the markers are placed on a whole image of the sample;

altering the magnification of the whole image based on instructions displayed on the display device for altering the magnification of the whole image to produce an altered magnification whole image; and causing new markers of a same size and configuration as the markers placed on the whole image to be placed on the altered magnification whole image.

* * * * *